(12) United States Patent
Priewasser

(10) Patent No.: US 9,397,000 B2
(45) Date of Patent: Jul. 19, 2016

(54) WAFER PROCESSING METHOD

(71) Applicant: DISCO CORPORATION, Tokyo (JP)

(72) Inventor: Karl Heinz Priewasser, Munich (DE)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 14/698,321

(22) Filed: Apr. 28, 2015

(65) Prior Publication Data
US 2015/0325480 A1    Nov. 12, 2015

(30) Foreign Application Priority Data

May 7, 2014  (JP) .................................. 2014-095686

(51) Int. Cl.
  *H01L 21/78*    (2006.01)
(52) U.S. Cl.
  CPC ...................................... *H01L 21/78* (2013.01)
(58) Field of Classification Search
  None
  See application file for complete search history.

(56) References Cited

U.S. PATENT DOCUMENTS

2014/0091458 A1*  4/2014  Van Gemert .......... H01L 21/561
                                                        257/737

FOREIGN PATENT DOCUMENTS

JP      2005-64230      3/2005
JP      2005-142398     6/2005

* cited by examiner

*Primary Examiner* — Charles Garber
*Assistant Examiner* — Stanetta Isaac
(74) *Attorney, Agent, or Firm* — Greer Burns & Crain, Ltd.

(57) ABSTRACT

A wafer has a substrate and a laminated layer formed on the substrate. The laminated layer includes low-permittivity insulating films. The laminated layer forms a plurality of crossing division lines and a plurality of devices formed in separate regions defined by the division lines. The processing method includes a cut groove forming step of cutting the substrate of the wafer along each division line by using a first cutting blade having a first thickness, thereby forming a cut groove having a depth smaller than the thickness of the substrate, so that a first uncut portion of the substrate is formed below the cut groove, and a dividing step of dividing the first uncut portion and the laminated layer along each division line by using a second cutting blade having a second thickness smaller than the first thickness or by etching after performing the cut groove forming step.

8 Claims, 8 Drawing Sheets

WAFER PROCESSING METHOD

BACKGROUND OF THE INVENTION

1. Field of the Invention

The present invention relates to a processing method for a wafer using low-permittivity insulating films (low-k films) as interlayer insulating films.

2. Description of the Related Art

In a semiconductor device fabrication process, a plurality of crossing division lines called streets are formed on the front side of a substantially disk-shaped semiconductor wafer such as a silicon wafer and a gallium arsenide wafer to thereby define a plurality of separate regions where a plurality of devices such as ICs and LSIs are respectively formed. After grinding the back side of such a semiconductor wafer by using a grinding apparatus to reduce the thickness of the wafer to a predetermined thickness, the semiconductor wafer is divided into a plurality of individual chips respectively corresponding to the plural devices by using a cutting apparatus or a laser processing apparatus. The chips thus obtained are widely used in various electrical equipment such as mobile phones and personal computers.

In general, a cutting apparatus called dicing saw is used as the cutting apparatus mentioned above. This cutting apparatus includes a cutting blade having a cutting edge having a thickness of 20 to 30 µm. The cutting edge is formed by bonding superabrasive grains such as diamond grains and CBN grains with metal or resin. The cutting blade is rotated at a high speed, e.g., 30000 rpm and lowered to cut into the semiconductor wafer, thereby cutting the semiconductor wafer. In each semiconductor device formed on the front side of the semiconductor wafer, a plurality of metal wiring layers are laminated for signal transmission, and these metal wiring layers are insulated from each other by interlayer insulating films formed mainly of $SiO_2$. In recent years, the distance between the adjacent wiring layers has become smaller in association with finer structure, causing an increase in capacitance between the adjacent wiring layers. As a result, there arises a remarkable problem such that signal delay occurs to invite an increase in power consumption.

To reduce a parasitic capacitance between the metal wiring layers, $SiO_2$ insulating films are mainly used as the interlayer insulating films for insulating the metal wiring layers in forming the devices (circuits) in the prior art. However, low-permittivity insulating films (low-k films) lower in permittivity than the $SiO_2$ insulating films have recently been used as the interlayer insulating films. Examples of such low-permittivity insulating films having a permittivity (e.g., k=2.5 to 3.6) lower than the permittivity (k=4.1) of the $SiO_2$ films include inorganic films of SiOC, SiLK, etc., organic films such as polymer films of polyimide, parylene, polytetrafluoroethylene, etc., and porous silica films of methyl containing polysiloxane etc.

In the case of cutting a laminated layer including such low-permittivity insulating films along the division lines by using a cutting blade, there arises a problem such that the laminated layer is peeled off because the low-permittivity insulating films are very brittle like mica. To solve this problem, Japanese Patent Laid-open No. 2005-064230 or Japanese Patent Laid-open No. 2005-142398 has proposed a semiconductor wafer processing method including the steps of preliminarily applying a laser beam to a semiconductor wafer along the division lines to remove the laminated layer along the division lines and next cutting the semiconductor wafer along the division lines by using a cutting blade to thereby divide the wafer into individual chips.

SUMMARY OF THE INVENTION

In the semiconductor wafer processing method disclosed in Japanese Patent Laid-open No. 2005-064230 or Japanese Patent Laid-open No. 2005-142398, the laminated layer including low-k films is processed by using a laser beam to thereby prevent the peeling called delamination of the laminated layer. However, a plurality of passes of laser processing are required for the removal of the laminated layer along each division line, causing a reduction in productivity. Further, in the case that test circuits called TEG (Test Element Group) of metal such as aluminum or copper are formed on each division line, there is a problem such that metal burrs due to the TEG may appear on the front side of the wafer in performing the laser processing. The metal burrs cause a trouble such that bonding pads may be short-circuited or adjacent circuits may be damaged by the metal burrs dropped.

It is therefore an object of the present invention to provide a wafer processing method which can remove the laminated layer including low-permittivity insulating films along each division line without the occurrence of delamination.

In accordance with an aspect of the present invention, there is provided a processing method for a wafer composed of a substrate and a laminated layer formed on the substrate, the laminated layer including low-permittivity insulating films, the laminated layer forming a plurality of crossing division lines and a plurality of devices formed in separate regions defined by the division lines, the processing method including: a protective member providing step of providing a protective member on the laminated layer of the wafer; a holding step of holding the wafer through the protective member on holding means in the condition where the substrate of the wafer is exposed after performing the protective member providing step; a cut groove forming step of cutting the substrate of the wafer along each division line by using a first cutting blade having a first thickness after performing the holding step, thereby forming a cut groove having a depth smaller than the thickness of the substrate, so that a first uncut portion of the substrate is formed below the cut groove; and a dividing step of dividing the first uncut portion and the laminated layer along each division line by using a second cutting blade having a second thickness smaller than the first thickness or by etching after performing the cut groove forming step.

Preferably, the processing method for a wafer further includes a grinding step of grinding the substrate of the wafer to reduce the thickness of the wafer to a predetermined thickness before or after performing the dividing step.

Preferably, the cut groove forming step includes a first cut groove forming step of forming a first cut groove having a first width as the cut groove; the processing method further includes a second cut groove forming step of cutting the first uncut portion of the substrate along each division line by using the second cutting blade after performing the first cut groove forming step and before performing the dividing step, thereby forming a second cut groove having a depth smaller than the thickness of the first uncut portion and having a second width smaller than the first width, so that a second uncut portion of the substrate is formed below the second cut groove; and the dividing step includes an etching step of etching the second uncut portion and the laminated layer along each division line after performing the second cut groove forming step.

In the wafer processing method of the present invention, the protective member is first provided on the laminated layer of the wafer. Thereafter, the laminated layer is divided from the substrate side. Accordingly, the protective member is provided on the front side of the laminated layer in dividing the laminated layer, so that it is possible to prevent that delamination or burrs may appear on the front side of the laminated layer.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
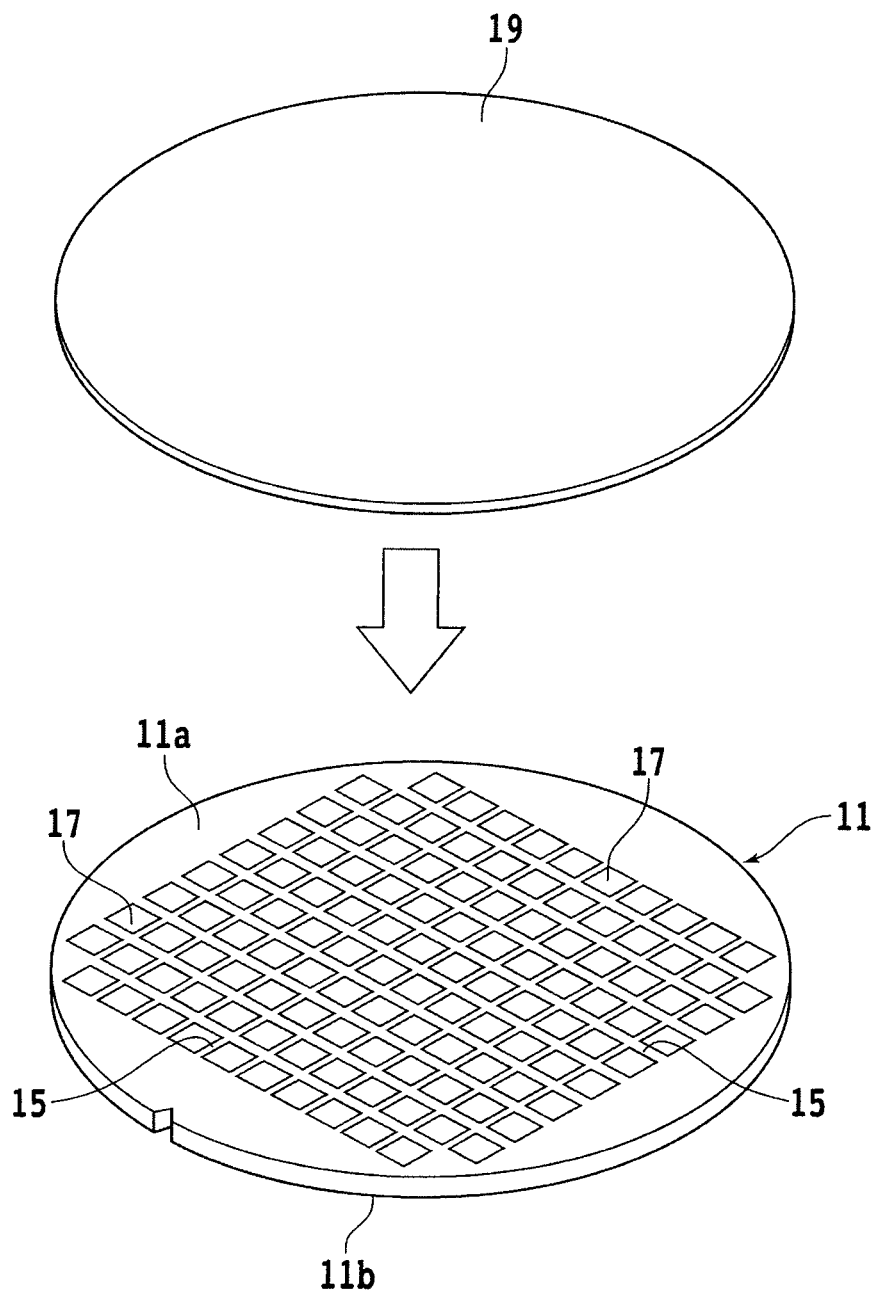
FIG. 1 is a perspective view showing a protective member providing step.
Figure 2:
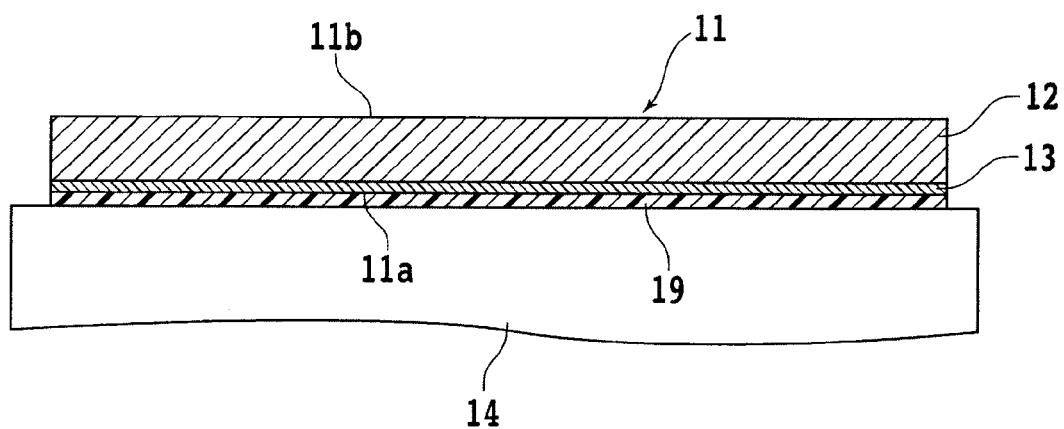
FIG. 2 is a sectional view showing a holding step.

A preferred embodiment of the present invention will now be described in detail with reference to the drawings. Referring to FIG. 1, there is shown a perspective view of a semiconductor wafer (which will be hereinafter referred to also simply as a wafer) 11 as viewed from the front side 11a thereof, wherein a protective tape 19 as a protective member is to be attached to the front side 11a of the semiconductor wafer 11. As shown in FIG. 2, the semiconductor wafer 11 is composed of a substrate 12 such as a silicon substrate and a laminated layer 13 formed on the substrate 12, wherein the laminated layer 13 includes low-permittivity insulating films (low-k films). That is, the laminated layer 13 is formed on the front side 11a of the wafer 11, wherein a plurality of crossing division lines (streets) 15 are formed from the laminated layer 13 and a plurality of devices 17 such as ICs and LSIs are formed from the laminated layer 13 in the separate regions defined by the division lines 15. For example, the wafer 11 is formed from a silicon wafer having a thickness of about 700 µm.

In performing a wafer processing method according to a first preferred embodiment of the present invention, a protective member providing step is first performed in such a manner that a protective member is provided on the laminated layer 13 of the wafer 11, more specifically, the protective tape 19 is attached to the front side 11a of the wafer 11 as shown in FIG. 1. Thereafter, as shown in FIG. 2, a holding step is performed in such a manner that the wafer 11 is held under suction through the protective tape 19 on a chuck table (holding means) 14 of a cutting apparatus (not shown) in the condition where the substrate 12 of the wafer 11 is exposed. That is, the wafer 11 is held on the chuck table 14 under suction in the condition where the protective tape 19 attached to the front side 11a of the wafer 11 is in contact with the upper surface of the chuck table 14 and the back side 11b of the wafer 11 is oriented upward as shown in FIG. 2.

Figure 3:
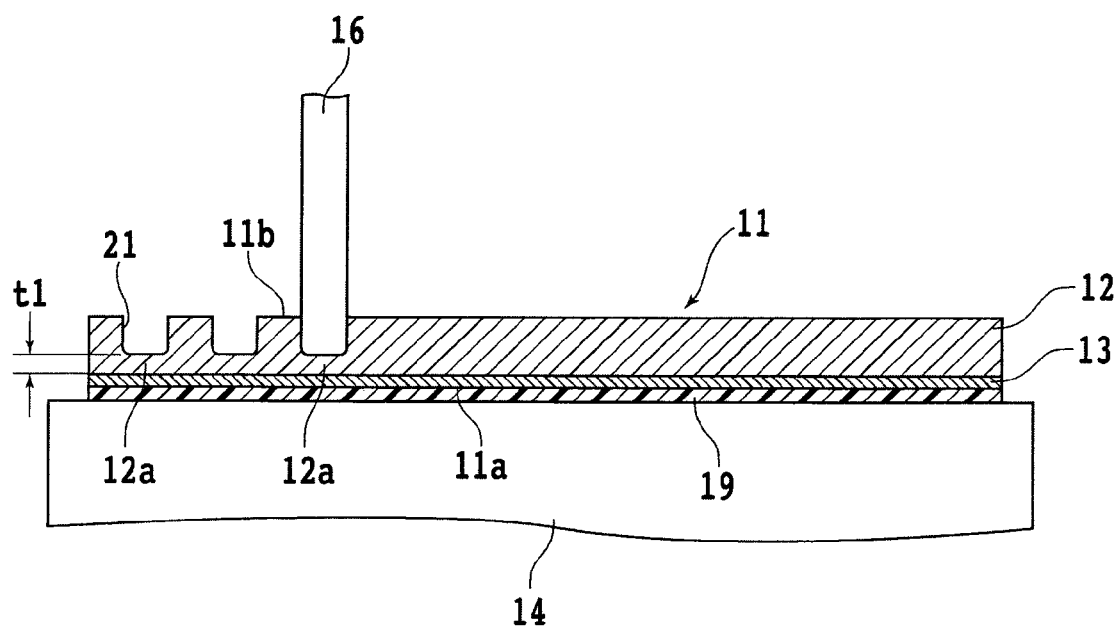
FIG. 3 is a sectional view showing a cut groove forming step.

Thereafter, as shown in FIG. 3, a cut groove forming step is performed in such a manner that the substrate 12 is cut along each division line 15 from the back side 11b of the wafer 11 held on the chuck table 14 by using a first cutting blade 16 having a first thickness, thereby forming a cut groove 21 having a depth smaller than the thickness of the substrate 12, so that an uncut portion 12a of the substrate 12 is formed below the cut groove 21. Preferably, the thickness t1 of the uncut portion 12a is set to about 150 to 200 µm. After performing the cut groove forming step along all of the division lines 15 extending in a first direction, the chuck table 14 is rotated 90° to similarly perform the cut groove forming step along all of the remaining division lines 15 extending in a second direction perpendicular to the first direction.

Figure 4:
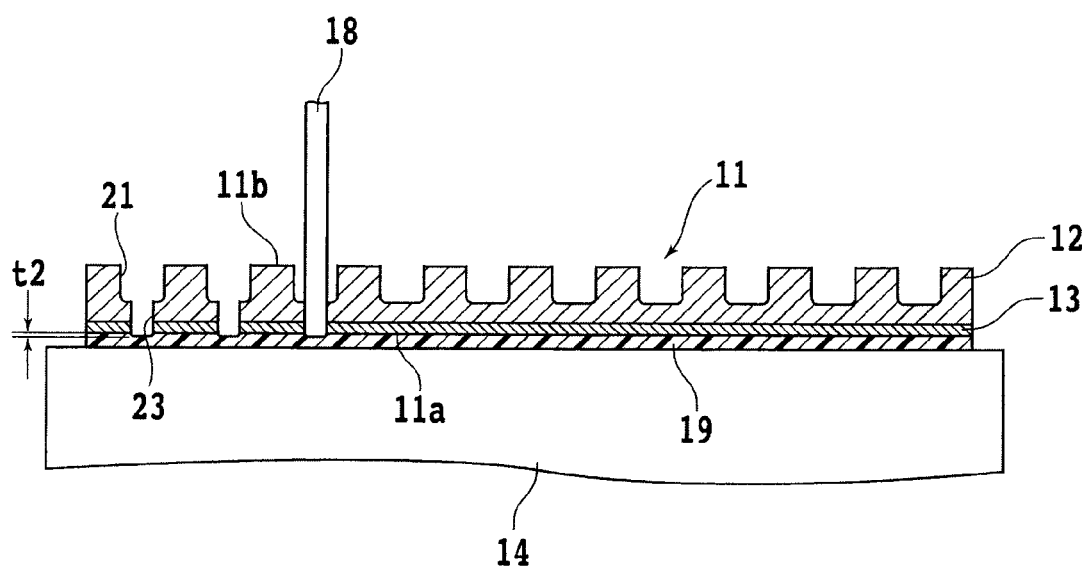
FIG. 4 is a sectional view showing a dividing step by a thin cutting blade according to a first preferred embodiment of the present invention.

After performing the cut groove forming step along each division line 15 as mentioned above, a dividing step is performed in such a manner that the uncut portion 12a and the laminated layer 13 are cut along each division line 15 by using a second cutting blade 18 having a second thickness smaller than the first thickness as shown in FIG. 4. In this dividing step, the protective tape 19 is also cut by a predetermined thickness t2 by using the second cutting blade 18 as shown in FIG. 4. Preferably, the predetermined thickness t2 is set to about 5 to 10 µm. Accordingly, a cut groove (division groove) 23 having a depth from the bottom of the cut groove 21 to the protective tape 19 is formed by performing the dividing step as shown in FIG. 4.

After performing the dividing step along all of the division lines 15 extending in the first direction, the chuck table 14 is rotated 90° to similarly perform the dividing step along all of the remaining division lines 15 extending in the second direction perpendicular to the first direction. Preferably, the thickness of the second cutting blade 18 to be used in the dividing step is set to 10 to 20 µm. It was confirmed that when the laminated layer 13 including low-k films was cut by the second cutting blade 18 having such a small thickness, delamination hardly occurred in the laminated layer 13. Even if delamination slightly occurs, it is possible to prevent that the delaminated films or metal burrs may stick to the front side (lower surface as viewed in FIG. 4) of the laminated layer 13 because the front side of the laminated layer 13 is covered with the protective tape 19.

The thickness of the first cutting blade 16 for forming the cut groove 21 shown in FIG. 3 is essentially larger than the thickness of the second cutting blade 18. Furthermore, the thickness of the first cutting blade 16 is preferably set so that the width of the cut groove 21 becomes so sufficient as to prevent the interference between the cut groove 21 and a hub in the case that the second cutting blade 18 is a known hub blade. While the dividing step is performed by using the second cutting blade 18 in this preferred embodiment, the dividing step may be performed by dry etching or wet etching.

Figure 5A:
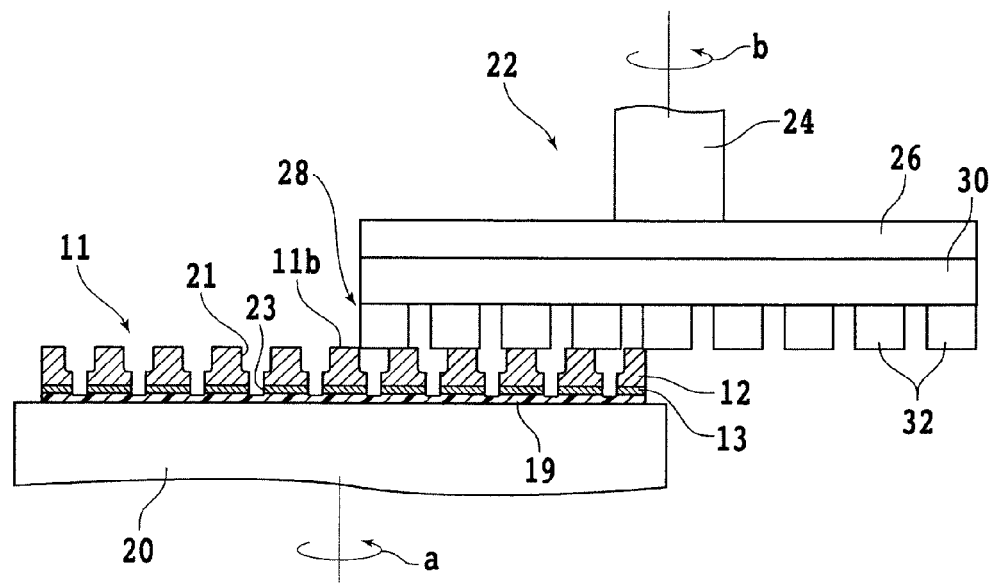
FIG. 5A is a partially sectional side view showing a grinding step.

Preferably, a grinding step of grinding the back side 11b of the wafer 11 to reduce the thickness of the wafer 11 is performed before or after performing the dividing step according to the present invention. In this preferred embodiment, the grinding step is performed after performing the dividing step. FIG. 5A shows the grinding step in this preferred embodiment. As shown in FIG. 5A, the wafer 11 processed by the dividing step mentioned above is held under suction through the protective tape 19 on a chuck table 20 included in a grinding apparatus (not shown). The grinding apparatus further includes a grinding unit 22 shown in FIG. 5A. The grinding unit 22 includes a spindle 24 adapted to be rotationally driven by a motor (not shown), a wheel mount 26 fixed to the lower end of the spindle 24, and a grinding wheel 28 detachably mounted on the lower surface of the wheel mount 26. The grinding wheel 28 is composed of an annular wheel base 30 and a plurality of abrasive members 32 fixed to the lower surface of the annular wheel base 30 so as to be arranged along the outer circumference thereof.

Figure 5B:
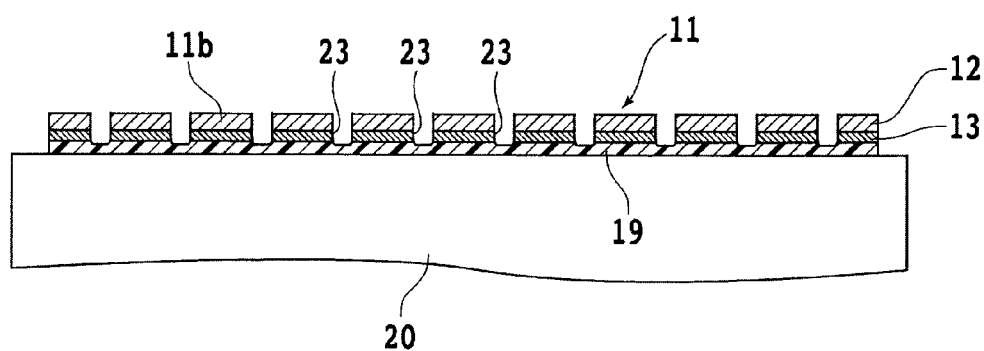
FIG. 5B is a sectional view of a wafer processed by the grinding step shown in FIG. 5A.

In performing the grinding step, the divided wafer 11 supported by the protective tape 19 is held on the chuck table 20 under suction in the condition where the protective tape 19 is in contact with the upper surface of the chuck table 20. Accordingly, the substrate 12 of the wafer 11 held on the chuck table 20 is exposed. That is, the back side 11b of the wafer 11 held on the chuck table 20 is oriented upward. Thereafter, the chuck table 20 is rotated at 300 rpm, for example, in the direction shown by an arrow a, and the grinding wheel 28 is also rotated at 6000 rpm, for example, in the direction shown by an arrow b. Thereafter, a grinding unit feeding mechanism (not shown) included in the grinding apparatus is operated to lower the grinding unit 22 until the abrasive members 32 of the grinding wheel 28 come into contact with the back side 11b of the wafer 11. Thereafter, the grinding wheel 28 is fed downward by a predetermined amount at a predetermined feed speed, thereby grinding the substrate 12 of the wafer 11. As a result, the thickness of the wafer 11 is reduced to a predetermined thickness (e.g., 50 μm) as shown in FIG. 5B.

Although the wafer 11 has been divided into individual chips by the dividing step prior to performing the grinding step, the individual chips are collected to maintain the form of the wafer 11 in the grinding step because the front side 11a of the wafer 11 is attached to the protective tape 19. Accordingly, the grinding step can be easily performed. After performing the grinding step, dry or wet etching is preferably performed to remove a grinding strain.

Figure 6:
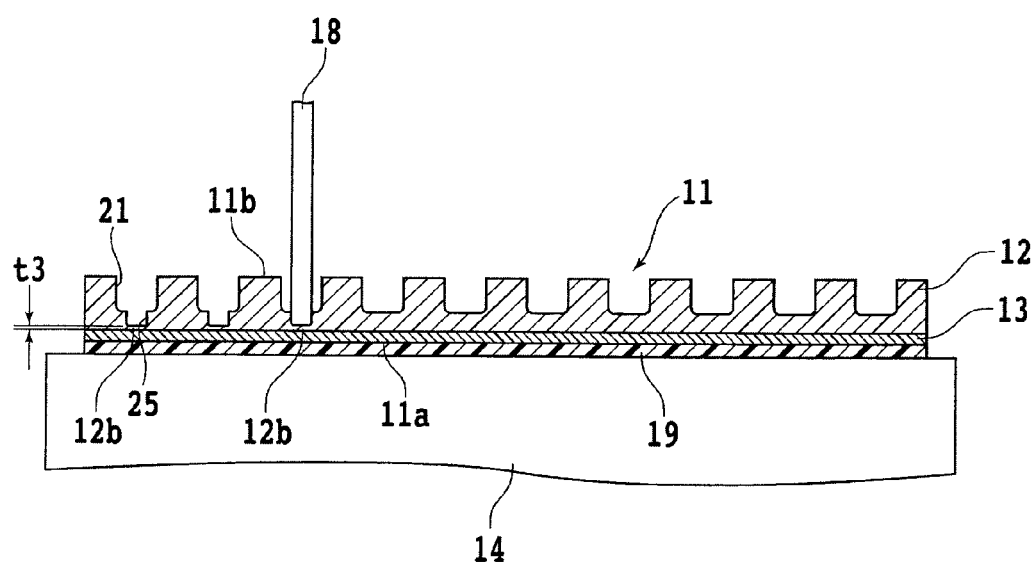
FIG. 6 is a sectional view showing a second cut groove forming step according to a second preferred embodiment of the present invention.
Figure 7:
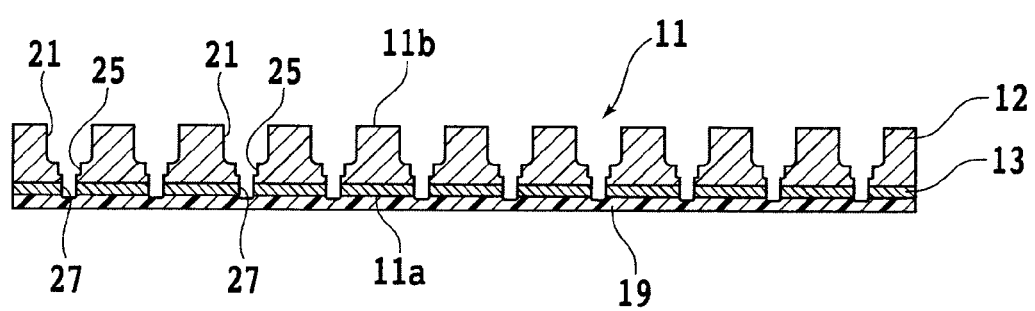
FIG. 7 is a sectional view showing a dividing step by etching according to the second preferred embodiment.
Figure 8:
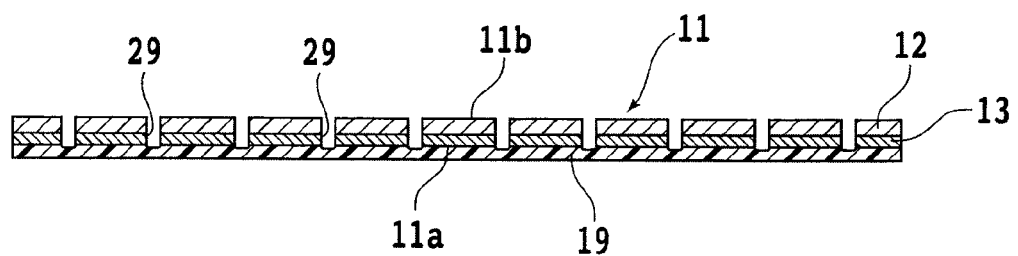
FIG. 8 is a sectional view of a wafer processed by grinding and etching after performing the dividing step shown in FIG. 7.

A wafer processing method according to a second preferred embodiment of the present invention will now be described with reference to FIGS. 6 to 8. The wafer processing method according to the second preferred embodiment includes a protective member providing step, a holding step, and a cut groove forming step similar to those of the first preferred embodiment, and the description thereof will be omitted herein. After performing the cut groove forming step (first cut groove forming step) in the second preferred embodiment to form the cut groove (first cut groove) 21 along each division line 15, a second cut groove forming step is performed in such a manner that the uncut portion (first uncut portion) 12a of the substrate 12 is cut along each division line 15 by using the second cutting blade 18 having a thickness smaller than that of the first cutting blade 16, thereby forming a second cut groove 25 having a depth smaller than the thickness of the uncut portion 12a, so that an uncut portion (second uncut portion) 12b of the substrate 12 is formed below the second cut groove 25. Preferably, the thickness t3 of the uncut portion 12b is set to about 5 to 10 μm.

After performing the second cut groove forming step along all of the division lines 15 extending in the first direction, the chuck table 14 is rotated 90° to similarly perform the second cut groove forming step along all of the remaining division lines 15 extending in the second direction perpendicular to the first direction. After performing the second cut groove forming step, the wafer 11 is loaded into an etching chamber (not shown) to perform dry etching or wet etching, thereby dividing the wafer 11 into the individual chips (dividing step). That is, the uncut portion 12b and the laminated layer 13 are etched along each division line 15 to thereby obtain the individual chips. As a result, a division groove 27 is formed by etching along each division line 15 as shown in FIG. 7.

After performing the dividing step by etching, a grinding step is preferably performed in such a manner that the back side 11b of the wafer 11 is ground to reduce the thickness of the wafer 11 to a predetermined thickness. This grinding step is similar to the grinding step in the first preferred embodiment described with reference to FIGS. 5A and 5B, and the description thereof will be omitted herein. Preferably, CMP (Chemical Mechanical Polishing) or dry or wet etching is performed after performing the grinding step, thereby removing a grinding strain. By performing etching after the grinding step, each division groove 27 is etched to some extent to become a division groove 29 slightly increased in width as shown in FIG. 8.

According to the wafer processing method described above, the protective tape 19 is first attached to the front side of the laminated layer 13 of the wafer 11, and the substrate 12 of the wafer 11 is next cut along each division line 15 from the back side of the substrate 12 by using the first cutting blade 16. Thereafter, the laminated layer 13 is divided along each division line 15 by using the second cutting blade 18 having a thickness smaller than that of the first cutting blade 16 or by etching. As described above, the protective tape 19 is attached to the front side of the laminated layer 13 before dividing the laminated layer 13. Accordingly, even if delamination slightly occurs in the laminated layer 13 in dividing the laminated layer 13 by using the second cutting blade 18, it is possible to prevent that the delaminated films or metal burrs may stick to the front side of the laminated layer 13. In the case of dividing the laminated layer 13 by dry or wet etching, there is no possibility of delamination in the laminated layer 13.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A processing method for a wafer composed of a substrate and a laminated layer formed on the substrate, the laminated layer including low-permittivity insulating films, the laminated layer forming a plurality of crossing division lines and a plurality of devices formed in separate regions defined by the division lines, the processing method comprising:

a protective member providing step of providing a protective member on the laminated layer of the wafer;

a holding step of holding the wafer through the protective member on holding means in the condition where the substrate of the wafer is exposed after performing the protective member providing step;

a cut groove forming step of cutting the substrate of the wafer along each division line by using a first cutting blade having a first thickness after performing the holding step, thereby forming a cut groove having a depth smaller than the thickness of the substrate, so that a first uncut portion of the substrate is formed below the cut groove, wherein the cut groove formed by the first cutting blade does not extend into the laminated layer including the low-permittivity insulating films; and a dividing step of dividing the first uncut portion and the laminated layer along each division line by using a second cutting blade having a second thickness smaller than the first thickness or by etching after performing the cut groove forming step.

2. The processing method for a wafer according to claim 1, further comprising:
    a grinding step of grinding the substrate of the wafer to reduce the thickness of the wafer to a predetermined thickness before or after performing the dividing step.

3. The processing method for a wafer according to claim 1, further comprising:
    a grinding step of grinding the substrate of the wafer to reduce the thickness of the wafer to a predetermined thickness, wherein the grinding step is performed after performing the dividing step.

4. The processing method for a wafer according to claim 1, further comprising:
    a grinding step of grinding the substrate of the wafer to reduce the thickness of the wafer to a predetermined thickness,
    wherein the cut groove formed during the cut groove forming step is formed to a first depth within the substrate, and
    wherein the grinding step reduces the thickness of the substrate by an amount that is equal to or greater than the first depth.

5. The processing method for a wafer according to claim 1, wherein the first uncut portion has a thickness of between about 150 µm and about 200 µm.

6. A processing method for a wafer composed of a substrate and a laminated layer formed on the substrate, the laminated layer including low-permittivity insulating films, the laminated layer forming a plurality of crossing division lines and a plurality of devices formed in separate regions defined by the division lines, the processing method comprising:
    a protective member providing step of providing a protective member on the laminated layer of the wafer:
    a holding step of holding the wafer through the protective member on holding means in the condition where the substrate of the wafer is exposed after performing the protective member providing step;
    a cut groove forming step of cutting the substrate of the wafer along each division line by using a first cutting blade having a first thickness after performing the holding thereby forming a cut groove having a depth smaller than the thickness of the substrate, so that a first uncut portion of the substrate is formed below the cut groove; and
    a dividing step of dividing the first uncut portion and the laminated layer along each division line by using a second cutting blade having a second thickness smaller than the first thickness or by etching after performing the cut groove forming step,
    wherein the cut groove forming step includes a first cut groove forming step of forming a first cut groove having a first width as the cut groove;
    the processing method further comprises a second cut groove forming step of cutting the first uncut portion of the substrate along each division line by using the second cutting blade after performing the first cut groove forming step and before performing the dividing step, thereby forming a second cut groove having a depth smaller than the thickness of the first uncut portion and having a second width smaller than the first width, so that a second uncut portion of the substrate is formed below the second cut, wherein the second cut groove formed by the second cutting blade does not extend into the laminated layer including the low-permittivity insulating films; and
    the dividing step includes an etching step of etching the second uncut portion and the laminated layer along each division line after performing the second cut groove forming step.

7. The processing method for a wafer according to claim 6, further comprising:
    a grinding step of grinding the substrate of the wafer to reduce the thickness of the wafer to a predetermined thickness,
    wherein the first cut groove formed during the cut groove forming step is formed to a first depth within the substrate, and
    wherein the grinding step reduces the thickness of the substrate by an amount that is equal to or greater than the first depth.

8. The processing method for a wafer according to claim 6, wherein:
    the first uncut portion has a thickness of between about 150 µm and about 200 µm; and
    the second uncut portion has a thickness of between about 50 µm and about 10 µm.

* * * * *